(12) United States Patent
Auricchio et al.

(10) Patent No.: US 10,164,704 B2
(45) Date of Patent: *Dec. 25, 2018

(54) SATELLITE TRANSMITTER SYSTEM

(71) Applicant: Mission Microwave Technologies, LLC, Santa Fe Springs, CA (US)

(72) Inventors: Francis S Auricchio, Redonda Beach, CA (US); David Fieldhouse, Artesia, CA (US)

(73) Assignee: Mission Microwave Technologies, LLC, Santa Fe Springs, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/784,103

(22) Filed: Oct. 14, 2017

(65) Prior Publication Data
US 2018/0198517 A1 Jul. 12, 2018

Related U.S. Application Data

(63) Continuation of application No. 15/068,484, filed on Mar. 11, 2016, now Pat. No. 9,800,323.

(60) Provisional application No. 62/132,941, filed on Mar. 13, 2015.

(51) Int. Cl.
| | | |
|---|---|---|
| *H05K 7/20* | (2006.01) | |
| *H04B 1/036* | (2006.01) | |
| *H04B 7/185* | (2006.01) | |
| *H04B 1/04* | (2006.01) | |

(52) U.S. Cl.
CPC ......... *H04B 7/18515* (2013.01); *H04B 1/036* (2013.01); *H04B 1/04* (2013.01); *H05K 7/20136* (2013.01); *H04B 2001/0491* (2013.01); *Y02D 70/12* (2018.01); *Y02D 70/122* (2018.01); *Y02D 70/446* (2018.01)

(58) Field of Classification Search
None
See application file for complete search history.

(56) References Cited

U.S. PATENT DOCUMENTS

| | | | |
|---|---|---|---|
| 8,248,318 B2* | 8/2012 | Wahlberg | H01Q 1/02 343/757 |
| 9,800,323 B2* | 10/2017 | Auricchio, Jr. | H04B 7/18515 |
| 2002/0080584 A1* | 6/2002 | Prasher | H01L 23/427 361/702 |
| 2014/0014308 A1* | 1/2014 | Wu | F28F 3/02 165/185 |

(Continued)

*Primary Examiner* — Lana N Le
(74) *Attorney, Agent, or Firm* — Christopher P. Maiorana, PC

(57) ABSTRACT

A satellite transmitter module for accepting input signals and emitting output signals for uplink transmission. The module includes a transmitter unit that includes i) transmitter circuitry, ii) at least one input port, iii) and at least one output port. At least one heat sink coupled to the transmitter unit includes a plurality of heat sink fins, wherein at least two of the plurality of heat sink fins are of different heights. A fan is capable of generating air flow parallel with the plurality of heat sink fins. The module further includes an outer enclosure that i) encloses the transmitter unit and the plurality of heat sink fins and ii) is impermeable to the air flow generated by the fan. The outer enclosure includes an enclosure cross section shape that is substantially similar to the at least one heat sink cross section shape defined by the height of each of the plurality of the heat sink fins.

20 Claims, 9 Drawing Sheets

(56) References Cited

U.S. PATENT DOCUMENTS

| | | | |
|---|---|---|---|
| 2014/0311725 A1* | 10/2014 | Balasubramanian | F28F 3/04 |
| | | | 165/168 |
| 2016/0119013 A1* | 4/2016 | Wojcik | G06K 7/082 |
| | | | 455/573 |
| 2017/0064865 A1* | 3/2017 | Kuwahara | H05K 7/20154 |
| 2017/0215302 A1* | 7/2017 | Totani | H05K 7/20509 |
| 2018/0017345 A1* | 1/2018 | Poltorak | F28F 13/06 |

* cited by examiner

Mass = 2.7 lbs

SATELLITE TRANSMITTER SYSTEM

CROSS-REFERENCE TO RELATED APPLICATION

This application is a continuation application of U.S. Nonprovisional patent application Ser. No. 15/068,484, filed on Mar. 11, 2016, which further claims priority to a provisional application Ser. No. 62/132,941, filed on Mar. 13, 2015, which are incorporated by reference in their entirety herein.

FIELD OF INVENTION

This disclosure generally relates to a satellite transmitter system, and more specifically, to a satellite transmitter system that includes a transmitter module capable of more efficiently dissipating heat.

BACKGROUND

Terrestrial satellite transmitter systems are used for uplink signal transmissions in satellite communications. Generally, a satellite transmitter system includes an upconverter module that converts lower frequency modem data signals into higher frequency signals for an uplink signal transmission to a satellite and/or a power amplifier to increase the power of these higher frequency signals to levels adequate to reach the distant satellite with sufficient strength. Moreover, these transmitters are often referred to as a block upconverter (BUC) in the satellite communications industry, despite of the presence or absence of a power amplifier. This block upconverter is generally coupled with an orthogonal mode transducer that faces a parabolic reflector dish that is directed towards a specific satellite. Many times these block upconverters are used in portable satellite uplink systems. Furthermore, because conventional transmitter modules are constructed with many off-the-shelf components (i.e., a upconverter module, a power amplifier, a power supply, etc.), the casing and the chassis of a conventional transmitter module must be sufficiently large to house each off-the-shelf component. As a result, conventional transmitter modules include a rectangular (or square) cross sectioned form factor and are extremely heavy and cumbersome to carry and to set up, especially for use out in the field.

As consumers demand more data-rich media, satellite transmitter manufacturers are continually upgrading their products to handle higher uplink data-rate communication. However, in order to achieve these higher uplink data rates, the power requirements for uplink data signal transmission increases, together with the heat produced by the transmitter circuitry (e.g., a microwave power amplifier) are considerable. As these power levels increase, the conventional transmitter block upconverter modules with rectangular or square cross sections continue to grow, resulting in very large and heavy units that are inefficient at properly dissipating heat from the transmitter circuitry.

In addition to the demand for higher-power satellite transmitters capable of delivering higher data rates, consumers are also demanding that these transmitters be portable for mobile and quick-deploy applications. The importance of reducing the satellite transmitter's size and weight cannot be overstated for these portable applications.

Conventional satellite uplink transmitters include heat sinks with heat sink fins of equal height that are uniformly distributed across the surface area of the unit regardless of the location of the fins relative to the areas of greatest heat dissipation, resulting in a square or rectangular cross section. These heat sink fins of equal height utilized within a conventional transmitter block dissipate heat extremely inefficiently with regard to their size and weight, because the heat sink fins located at the areas of greatest heat levels generated by the transmitter circuitry are of the same height as the heat sink fins located at the lowest heat levels. These underutilized heat sink fins furthest from the areas of greatest heat levels add unnecessary weight and size to the overall block transmitter. This extra weight and size of these underutilized heat sink fins leads to higher material costs to build a conventional block transmitter and detracts from the portability of the unit.

Furthermore, because most air fans include rotating fan blades that form a circular cross section, managing the air flow within a rectangular cross section of a transmitter coupled with a circular cross sectioned air fan or fans is difficult and more costly. For example, using a circular fan that includes circular vanes and fan blades that form a circular cross section coupled with a rectangular-cross-section transmitter may lead to air flow distribution issues, air pressure differential issues, etc. To mitigate these issues and interface both the rectangular cross sectioned transmitter with the circular cross sectioned air fan, conventional transmitter designers have included a plenum chamber (i.e., an empty chamber) to help equalize air pressure within the unit for more even distribution of air flow. A similar issue occurs when using a row of several circular fans; a pressure-equalizing plenum is needed to ensure proper airflow across the heat sinking fins. However, utilizing one or more plenum, again, adds weight and volume to the transmitter unit.

SUMMARY

A satellite uplink transmitter module for transmitting signals for uplink signal transmission in a satellite communication system includes a transmitter unit that includes i) transmitter circuitry, ii) an input signal port, iii) and a transmit output signal port, the transmitter circuitry generating heat. The transmitter circuitry may contain frequency conversion circuitry to convert from a typically lower-frequency modem signal to a typically higher-frequency radio frequency (RF) satellite uplink signal. The transmitter circuitry may also contain amplification circuitry to increase the typically lower-power input signal to a higher-power output signal suitable for communication with a distant satellite. The satellite uplink transmitter module also includes at least one heat sink coupled to the transmitter unit, the at least one heat sink including a plurality of heat sink fins, wherein at least two of the plurality of heat sink fins are of different heights and an air fan capable of generating air flow parallel with the heat sink fins. The satellite uplink transmitter module includes an outer enclosure that i) encloses the transmitter unit and the plurality of heat sink fins and ii) is impermeable to the air flow generated by the air fan, the outer enclosure including an enclosure cross section shape that is substantially similar to a heat sink cross section shape that is defined by the height of each of the plurality of the heat sink fins.

According to one embodiment of the invention, a satellite transmitter module accepts input signals and emits output signals for uplink transmission in a satellite communication system. A transmitter unit includes i) a transmitter circuitry, ii) at least one input port, iii) and at least one output port. At least one heat sink is coupled to the transmitter unit. The at least one heat sink includes a plurality of heat sink fins, wherein at least two of the plurality of heat sink fins are of different heights. The at least one heat sink is positioned in a close proximity to the transmitter circuitry for dissipating heat generated from the transmitter circuitry. A fan generates air flow substantially parallel with spaces between the plurality of heat sink fins. An outer enclosure i) encloses the transmitter unit and the plurality of heat sink fins therein and ii) is impermeable to the air flow generated by the fan. The outer enclosure includes a cross section shape substantially similar to a contour of the at least one heat sink cross section shape defined by the heights of the plurality of the heat sink fins.

According to another embodiment, a satellite transmitter module accepts input signals and emits output signals for uplink transmission in a satellite communication system. The satellite communication system includes a transmitter that includes a transmitter circuitry for transmitting a suitable satellite communications signal. At least one heat sink is thermally coupled to the transmitter. The at least one heat sink includes a plurality of heat sink fins, wherein at least two of the plurality of heat sink fins comprise heights as a function of a distance between the plurality of heat sink fins and the transmitter. The at least one heat sink is positioned in a close proximity to the transmitter for dissipating thermal energy generated from the transmitter. A fan, disposed at a distal end of the transmitter, generates air flow substantially parallel with spaces between the plurality of heat sink fins. An outer enclosure i) encloses the transmitter and the plurality of heat sink fins therein.

According to a further embodiment of the invention, a manufacturing process or method reduces thermal energy in a satellite transmitter module. The process includes connecting a plurality of heat sink fins to a transmitter. The transmitter transmits a suitable satellite communications signal and generates thermal energy. Each of the plurality of heat sink fins includes a height, wherein at least two heights being determined as a function of a distance between the each of the plurality of the heat sink fins and the transmitter. The process further includes generating air flow substantially parallel with spaces between the plurality of heat sink fins via a fan. The method also includes enclosing the plurality of heat sink fins and the transmitter in a housing. The housing includes a cross section shape defined by the height of each of the plurality of heat sink fins.

BRIEF DESCRIPTIONS OF THE DRAWINGS

Corresponding reference characters indicate corresponding parts throughout the drawings.

DETAILED DESCRIPTION

Figure 1:
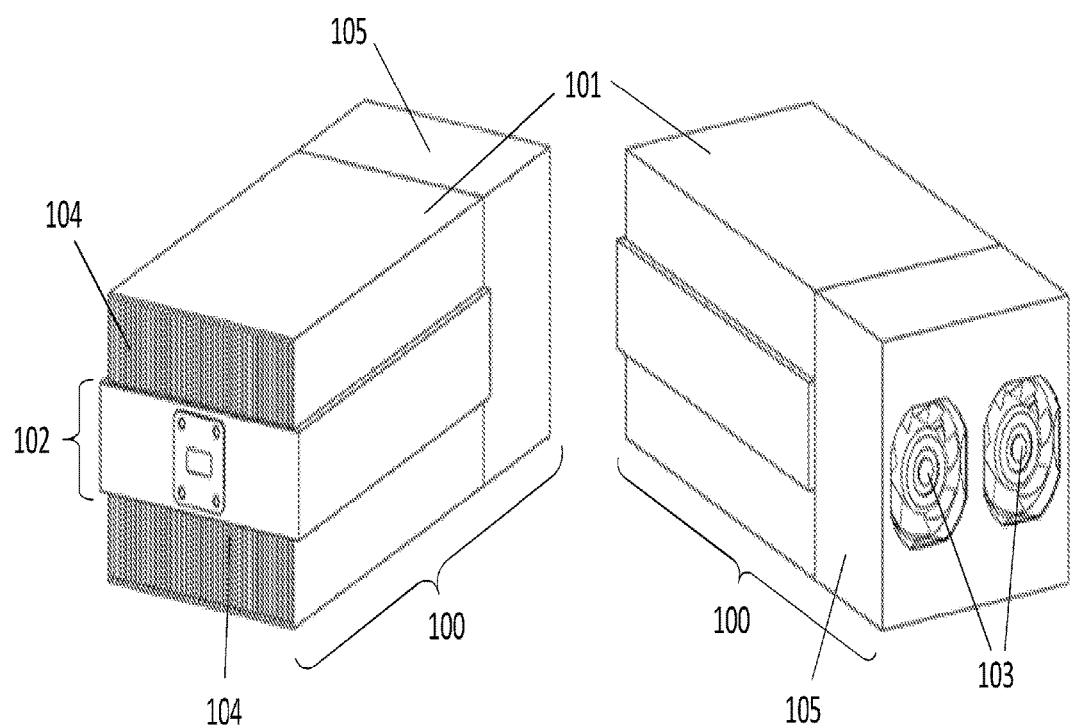
FIG. 1 depicts an exemplary prior art satellite uplink transmitter module with square or rectangular cross section that includes a secured outer enclosure that encloses a transmitter unit and heat sink(s) according to one embodiment of the invention.

Generally speaking, a satellite transmitter system includes a transmitter module that, via its rounded form factor, more efficiently dissipates high levels of heat that is generated while converting and amplifying lower frequency and lower power data signals into higher frequency and higher power satellite transmission signals (i.e., "upconverting" and "amplifying"). For example, the uplink transmitter module may be coupled with a rounded cross sectioned fan that allows for more even and optimized airflow distribution (i.e., better heat dissipation) within the rounded form factor of the transmitter module. Moreover, the transmitter module may include one or more heat sinks coupled to a transmitter unit that processes frequency conversions and amplifications, generating the high levels of heat. Importantly, each heat sink may include a plurality of heat sink fins, and depending on the heat level generated at particular location of the transmitter unit, a differently sized heat sink fin may be employed at that particular location associated with the transmitter unit. For example, the highest level of heat of the transmitter unit within the transmitter module may be generated along a longitudinal central axis of the transmitter unit. To properly dissipate this high level of heat, a heat sink fin with a height higher than all other heat sink fins may be located along the central axis of the transmitter unit. Other heat sink fins not located on the central axis of the transmitter unit may be shorter than those located along the central axis because the heat dissipation requirements associated with these other locations not on the central axis of the transmitter unit are lower. As result, the more streamlined and optimized airflow in conjunction with the differently sized heat sink fins allows more efficient (in terms of heat sink volume and mass) heat dissipation from the transmitter unit within the transmitter module.

Advantageously, this exemplary configuration of the transmitter system allows for more optimized heat dissipation, better internal air flow, better external aerodynamics (i.e., high wind conditions), better solar reflecting, and, importantly, a lighter-weight and lower-volume transmitter module. For example, interfacing a rounded cross sectioned fan (i.e., rotating fan blades) with a round cross section transmitter module better equalizes air pressure internal to the transmitter module and reduces wasted or turbulent air flow present in a rectangular cross sectioned transmitter. Furthermore, in utilizing a rounded cross sectioned fan in conjunction with the round cross sectioned transmitter module, there is no need for a plenum chamber (and its associated weight and size requirements) to assist in evenly distributing air flow within the transmitter module, further reducing the size and weight of the transmitter module.

Moreover, a rounded cross section transmitter module weighs less and is smaller in size relative to a rectangular cross section transmitter because the rounded cross sectioned transmitter module lacks corners (i.e., uses less material) and may include heat sink fins that are shorter (i.e., uses less material) at locations on the transmitter unit that are laterally further away from the longitudinal central axis of the transmitter module. For example, the cross section area of a circular cross sectioned transmitter module is roughly 21% smaller compared to the cross section area a square cross sectioned transmitter. In this example, if each heat sink fin was sized according to the cross section of each respective transmitter module, the circular cross sectioned transmitter module uses roughly 21% less heat sink fin material and is 21% less in mass compared to the square cross sectioned transmitter. These size and weight reductions are especially important in portable satellite communications systems.

FIG. 1 illustrates a prior art satellite transmitter module typical of what is offered in the industry. As shown in FIG. 1, the fully assembled satellite transmitter module 100 may include an outer enclosure 101, a transmitter unit 102, one or more fans 103, and one or more heat sinks 104 that are coupled to the transmitter unit. In this conventional approach, the heat sinks comprise several fins, which are all of the same height. This results in the satellite transmitter module having a substantially rectangular (including square) cross sectional shape. This shape, as has been discussed previously, is not the most efficient for heat removal as it results in excess size and weight due to the oversized heat sinking fins in areas of low power dissipation as well as often requiring a plenum chamber 105 to assist in the airflow distribution.

Figure 2:
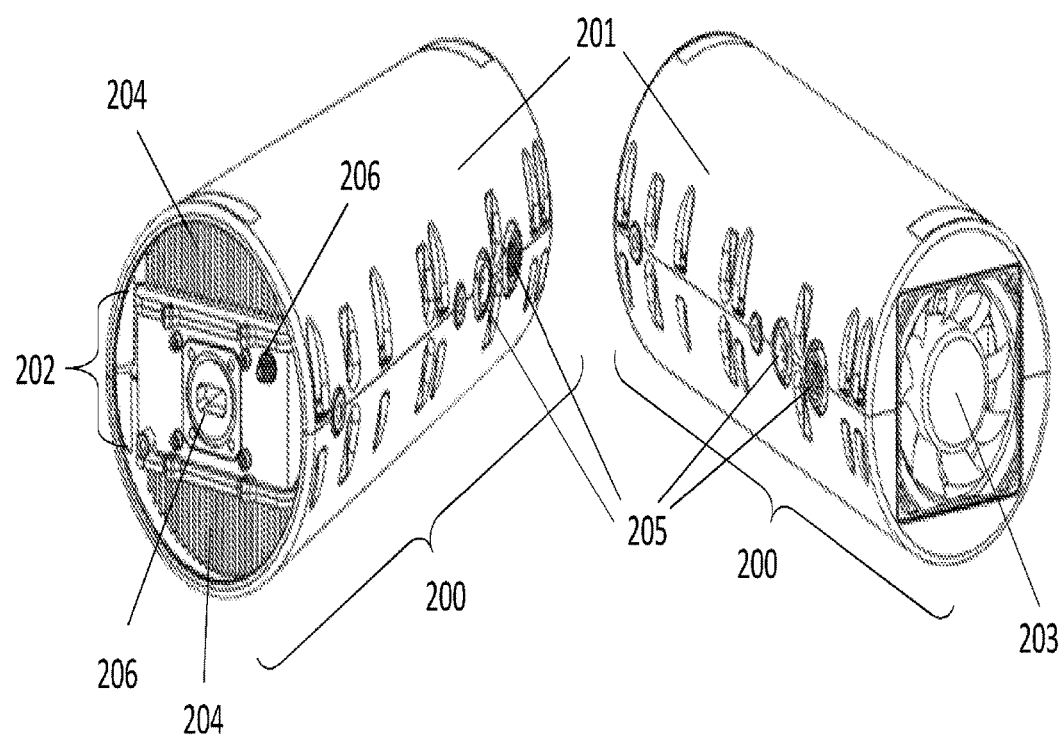
FIG. 2 depicts an exemplary satellite uplink transmitter module that includes a secured outer enclosure that encloses a transmitter unit and heat sink(s) according to one embodiment of the invention.

FIG. 2 illustrates a satellite transmitter module 200 that may be integrated into an indoor or an outdoor satellite transmitter system according to one embodiment of the invention. As shown in FIG. 2, a fully assembled satellite transmitter module 200 may include an outer enclosure 201, a transmitter unit 202, one or more fans 203, and one or more heat sinks 204 that are coupled to the transmitter unit 202. A fully assembled satellite transmitter module 200, as shown in FIG. 2, may include a circular (or substantially circular, ellipsoidal, octagonal, or any other substantially rounded shape) form factor. The outer enclosure 201 (or a shell, a shroud, a housing, etc.) may encase the other transmitter components of the module 200, and as shown in FIG. 2. For example, the enclosure 201 may include two rounded shroud pieces fastened together (e.g., using screws or bolts, as shown in FIG. 2, or any other suitable manner to fasten two pieces of the enclosure securely together.) The enclosure 201 may assist in protecting and/or structurally supporting the rest of the transmitter module 200. Alternatively, the enclosure 201 may include three or more pieces fastened together or even one solid piece that may be removable from the other transmitter components of the transmitter module 200. The two open ends of the transmitter module 200, while not covered by the enclosure 201 as shown in FIG. 2, may alternatively be encased or covered by the enclosure 201 as well.

With continued reference to FIG. 2, the transmitter module 200 may further include one or more input ports 205, such as a power input port, a modem data input port, a control/monitor signal input (and/or output) port, a controller input, a local oscillator/clock input port, etc. and one or more output ports 206 (e.g., a radio frequency (RF) output port, a monitor output port, etc.) that are exposed and accessible while the enclosure is affixed, attached, or coupled to the transmitter unit 202. These input ports 205 and output ports 206 may be visible or accessible when the enclosure is coupled to the other transmitter components. The data input port may accept low frequency input signals in the range of 1-2 GHz, for example, and may include any type of interface, such as a coaxial cable, waveguide, etc. The monitor/control input and/or output may be implemented with a RS-232 serial communication protocol, or any other suitable protocol.

Figure 3:
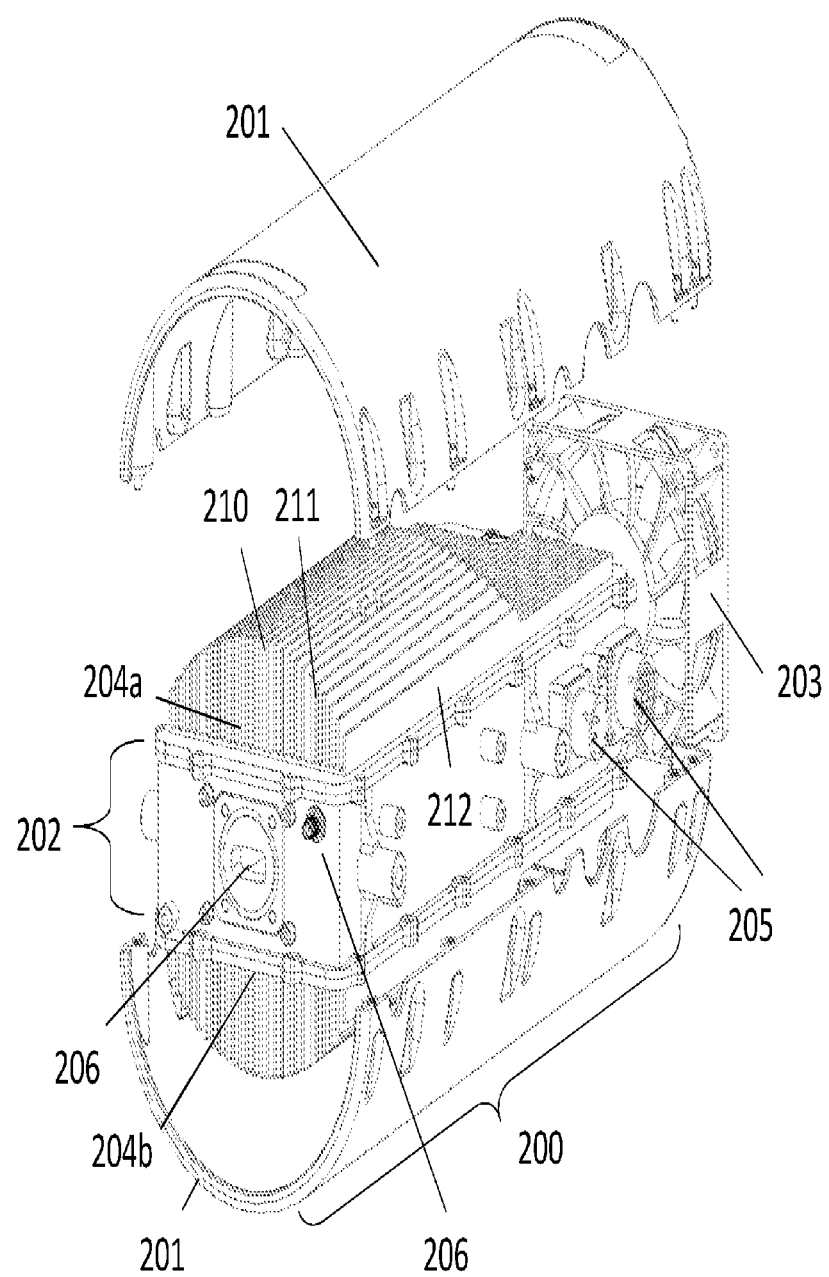
FIG. 3 illustrates an exploded diagram of an exemplary satellite uplink transmitter module that includes an outer enclosure, a transmitter unit, heat sink(s), and a fan according to one embodiment of the invention.

FIG. 3 illustrates an exploded diagram of the transmitter module 200 of FIG. 2, revealing the transmitter components encased by the enclosure 201. As shown in FIG. 3, a fan or fans 203 may be housed within the enclosure 201 and may include a circular cross section, as defined by the shape of the rotating fan blades. This fan may force air from outside the enclosure along or through the one or more heat sinks 204 coupled to the transmitter unit 202. The transmitter unit 202 contains transmitter circuitry, which may include a frequency converter, a power combiner, a power amplifier (e.g, a microwave power amplifier), a power supply, any other suitable subsystem unit utilized in transmitting a suitable satellite communications signal, or a combination thereof. In an alternative embodiment, an externally located upconverter module may be communicatively coupled to the transmitter module 200 that includes the power amplifier. In this alternative embodiment, the transmitter module 200 may receive the higher frequency upconverted signal from the external upconverter module, and the power amplifier within the transmitter module may amplify the upconverted signal for satellite transmission. Moreover, while depicted in FIG. 3 as substantially rectangular in shape, the transmitter unit 202 may be rounded, elliptical, triangular, or any other shape desired. Importantly, the location and the cross section of the heat sinks 204 and the location and size of each heat sinks' respective heat sink fins determines the efficiency of heat dissipation and the overall thermal performance of the transmitter module 202, while minimizing its size and weight. For example, as shown in FIG. 3, one configuration may include one heat sink 204a coupled to the top of the transmitter unit and one heat sink 204b coupled to the bottom of the transmitter unit 202. The transmitter module 200 is not limited to only two heat sinks; any number of heat sinks may be coupled to or integrated with the upconverter unit. It is also to be understood that the cross section shape of the heat sink fins on one side of the transmitter unit 202 needs not to be the same or substantially identical as the other side of the transmitter unit 202.

Continuing with this example, each heat sink includes a number of heat sink fins of different heights or sizes (210-212). As illustrated in FIG. 3, for example, each of these heat sink fins are positioned in parallel with each other despite each heat sink fin being of a different height. However, each heat sink fin need not be position in parallel with each other, but alternatively, each heat fin may be position in an outward radial manner from the transmitter unit 202, in a fractal pattern structure, in a lattice structure, or any other suitable heat sink fin design structure that is capable of dissipating heat through a large surface area to volume ratio. For example, the height or length of the heat sink fins extending away from the transmitter circuitry may be a function of a distance of the heat sink fins therefrom.

Moreover, each heat sink fin may run longitudinally (i.e., in the direction of air flow) for the entire length or a portion of the length of the transmitter module. Additionally, each heat sink fin may be part of one heat sink 204 (i.e., the heat sink includes a plate that each heat sink fin may be attached or affixed to) or each heat sink fin may be attached or affixed to the chassis or enclosure of the transmitter unit 202. For example, each heat sink fin 204 may be thermally coupled to the transmitter circuitry 202. Furthermore, each heat sink fin may comprise heat pipes, dimples, or other features to aid in dissipating the heat generated by the transmitter unit 202.

Moreover, based on the design of the heat sink fins according to aspects of the invention, the spacing between the apex or the outer edge of each of the heat sink fins and the interior of the enclosure 201 may be reduced to a minimum. For example, as shown in FIG. 1 in the prior art, the rectangular shape of the transmitter module enables more interior volume of air within its casing. This creates a bigger volume of air inside to assist dissipation of heat. However, such a design introduces problems in its overall size. Embodiments of the invention solve the problem elegantly: increase heat dissipation efficiency while reduce wasted space of the design.

With continued reference to FIG. 3, the height or the size of each heat sink fin (210-212) may be determined based on the relative location relationship of a particular heat sink fin with respect to heat generating regions of the transmitter unit. As a result, the plurality of heat sink fins may together form a particular cross section shape. For example, as shown in FIG. 3, the heat sink fins (201-212) on the top and on the bottom of the transmitter unit 202 both form a rounded, circular cross section. In this example, this circular cross section shape indicates that the most heat is generated along the longitudinal central axis of the transmitter unit 202 because the heat sink fins with the most height 210 are located along the central axis of the transmitter unit 202. Conversely, the heat sink fins with the least height 212, in this example, are found along edges (i.e., further distance from the central axis) of the transmitter unit.

Figure 4:
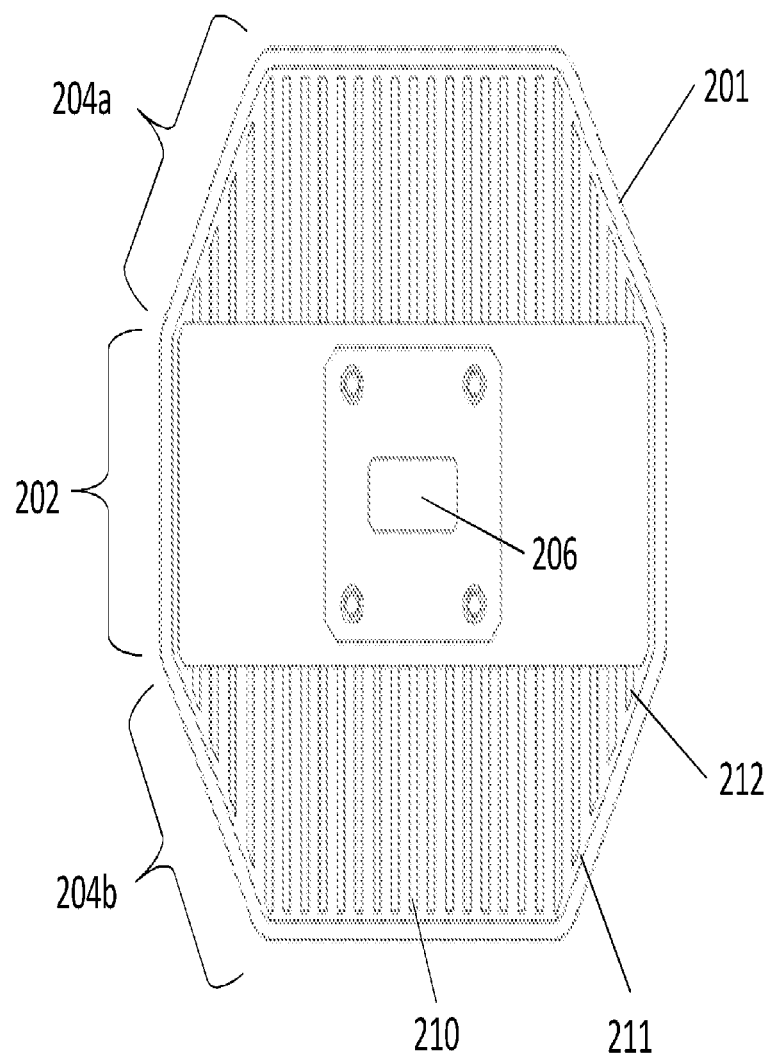
FIG. 4 depicts an exemplary satellite uplink transmitter module where the heat sinking fins and matching outer enclosure have an octagonal shape according to one embodiment of the invention.

Any type of cross section shape of the heat sink fins 210-212 may be employed to optimally dissipate heat based on the heat generated by a particular transmitter unit 202. For example, the cross section may be hexagonal, octagonal, elliptical, or any other suitable cross section shape. For example, FIG. 4 shows an alternative embodiment where the cross section is essentially octagonal. This end view figure shows that the heat sink 204 and its corresponding heat sink fins (210-212) have an octagonal cross section, with the outer enclosure 201 conforming to this octagonal shape. Again, the longest heat sink fins 210 are along the central axis, and the length of the heat sink fins taper to the edges 212 where they are shortest. This approach places the longest fins where they are needed most, and reduces the overall size and weight of the satellite transmitter module compared to a satellite transmitter module with a rectangular cross section.

Figure 5:
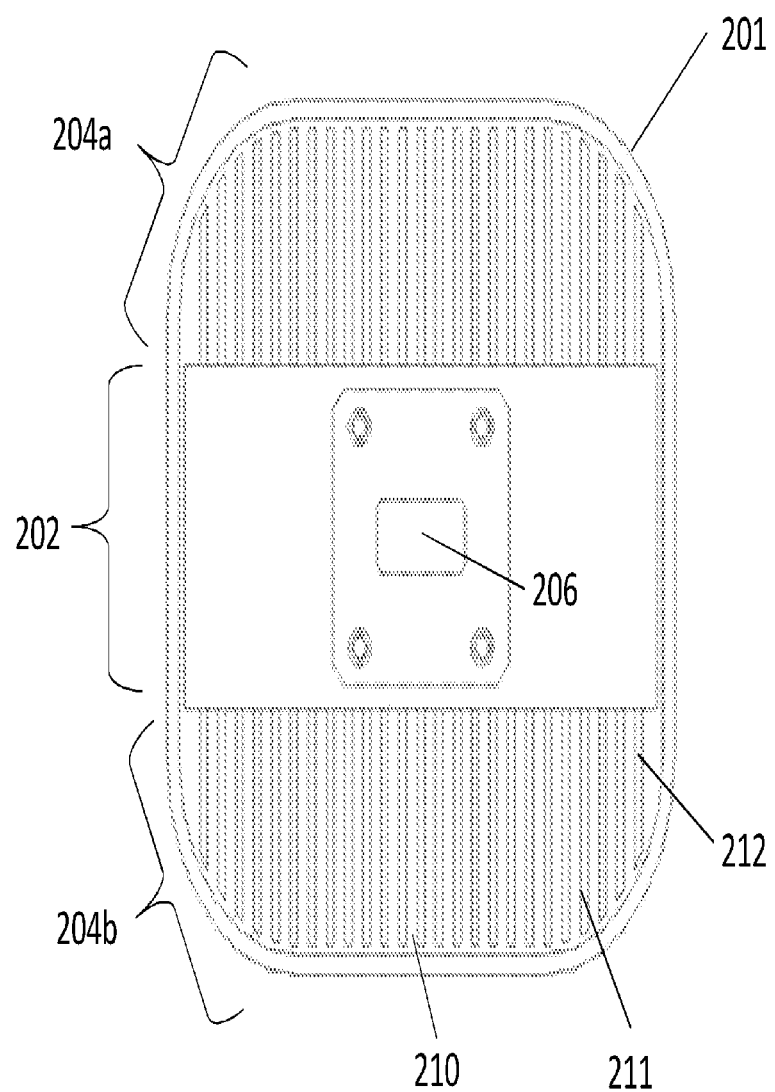
FIG. 5 depicts an exemplary satellite uplink transmitter module where the heat sinking fins and matching outer enclosure have a rounded-corner-rectangular shape according to one embodiment of the invention.

FIG. 5 shows another alternative embodiment, where the cross section is a rounded-corner rectangle. This end view figure shows that the heat sink 204 and its corresponding heat sink fins (210-212) have rounded-corner rectangular cross section, with the outer enclosure 201 conforming to this rounded-corner shape. Again, the longest heat sink fins 210 are along the central axis, and the length of the heat sink fins taper to the edges 212 where they are shortest. As before, this approach places the longest fins where they are needed most, and reduces the overall size and weight of the satellite transmitter module 200 compared to a satellite transmitter module with a rectangular cross section.

Figure 6:
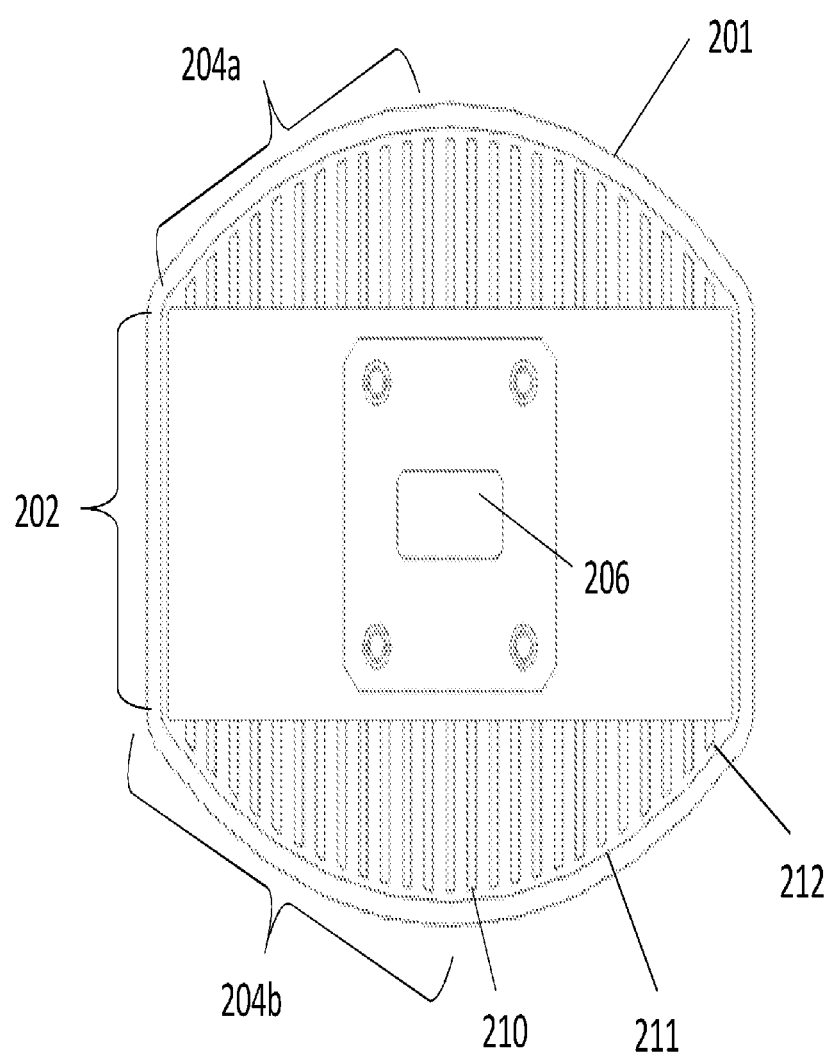
FIG. 6 depicts an exemplary satellite uplink transmitter module where the heat sinking fins and matching outer enclosure have an elliptical shape according to one embodiment of the invention.

Finally, FIG. 6 shows yet another alternative embodiment, where the where the cross section is elliptical. This approach might be more suitable for satellite transmitter modules 200 with a shorter but wider aspect ratio. This end view figure shows that the heat sink 204 and its corresponding heat sink fins (210-212) an oblate or elliptical cross section, with the outer enclosure 201 conforming to this elliptical shape. Again, the longest heat sink fins 210 are along the central axis, and the length of the heat sink fins taper to the edges 212 where they are shortest. As before, this approach places the longest fins where they are needed most, and reduces the overall size and weight of the satellite transmitter module compared to a satellite transmitter module with a rectangular cross section. It is to be understood that other shapes of the enclosure 201 may be used as a complimentary element to the heat sink fins 204 such that the heat sink fins 204 define the contour of the shape of the enclosure 201.

Figure 7:
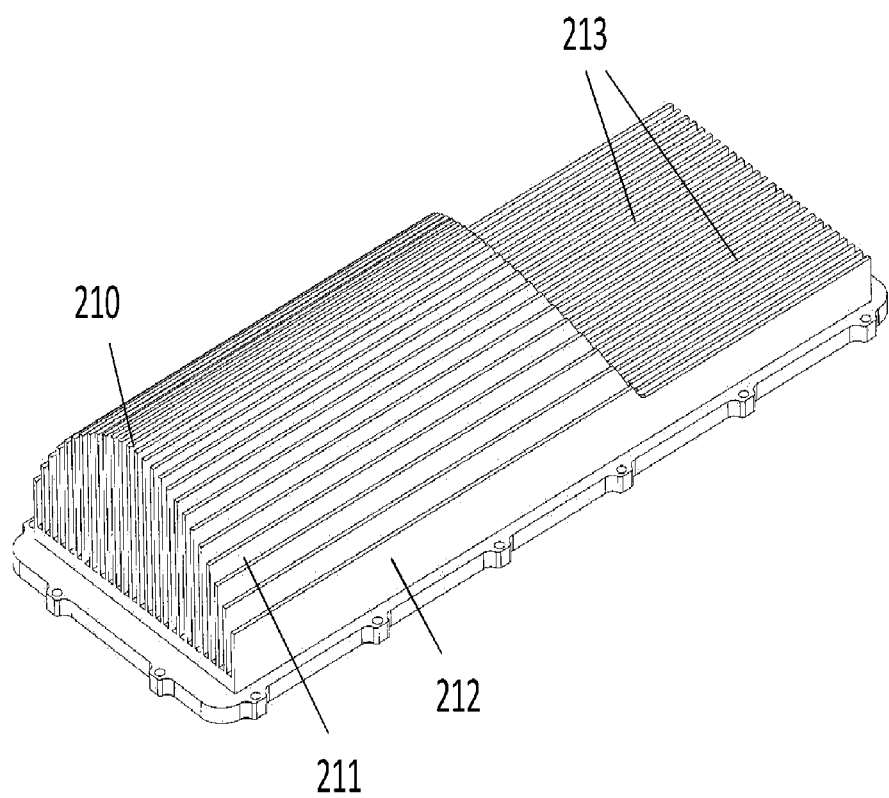
FIG. 7 depicts a heat sink including a plurality of heat sink fins for use in an exemplary satellite uplink transmitter module according to one embodiment of the invention.

As shown in FIG. 7, two different heat sinks may be used on the same side of a transmitter unit, or alternatively, one heat sink may include two different heat sink fin regions of heat sink fins. As shown in FIG. 7, for example, one heat sink fin region may include heat sink fins of different heights (210-212) to form a particular heat sink fin cross section (e.g., rounded) while a second or another region may include heat sink fins of the same height 213 to form a different heat sink fin cross section (e.g., rectangular).

Figure 8A:
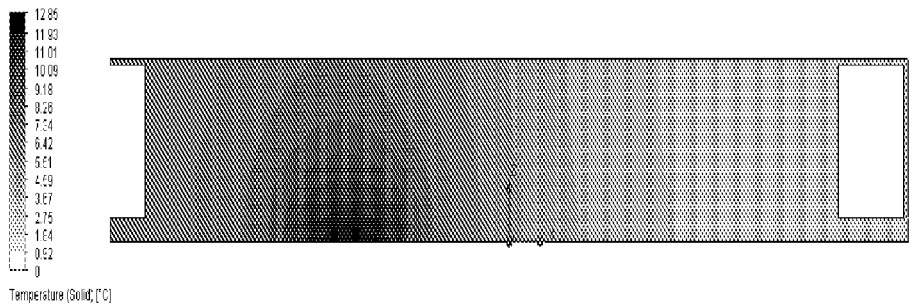
FIG. 8a illustrates a simulated thermal performance of an exemplary transmitter heat sink with a rounded cross section, according to one embodiment of the invention.
Figure 8A:
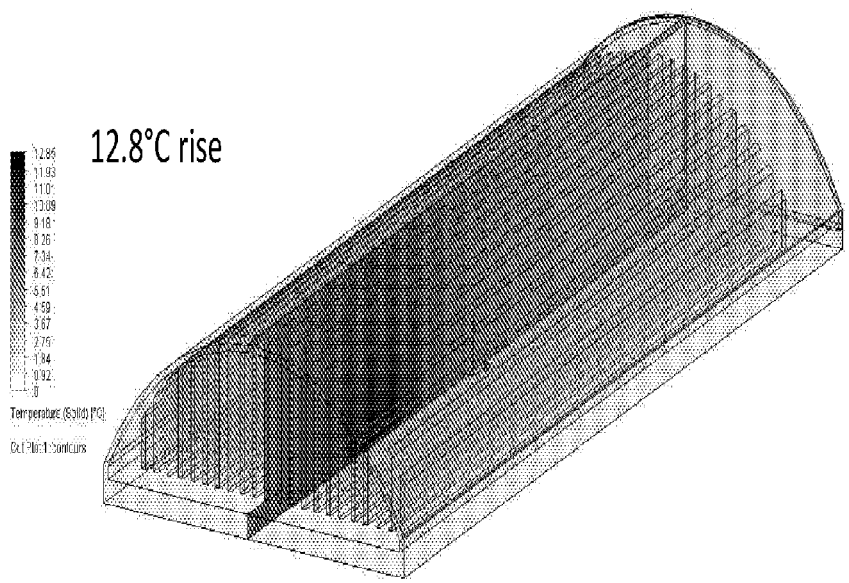
Figure 8B:
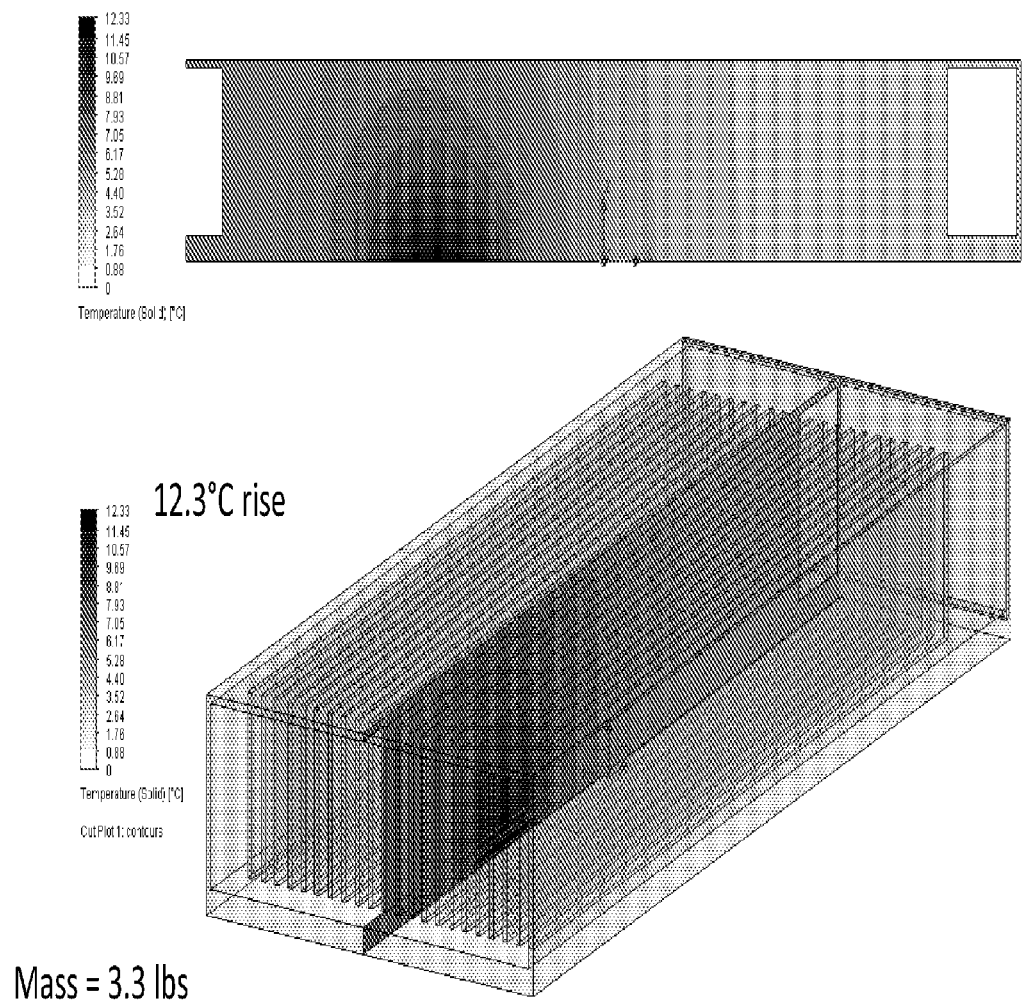
FIG. 8b illustrates a simulated thermal performance of an exemplary conventional transmitter heat sink with a rectangular cross section according to one embodiment of the invention.

FIG. 8 demonstrates the more efficient heat dissipation capabilities of the tapering heat sink fins according to one embodiment of the invention. In this example, FIG. 8a shows a gray-scaled heat map comparing the thermal performance of satellite transmitter modules with two different cross sections. FIG. 8a shows the thermal performance of a module with a heat sink with a substantially circular cross section, like the one shown in FIG. 2. Only half of the structure is simulated, taking advantage of symmetry to reduce simulation times. In this example, the highest level of heat generated occurs in the central axis of the satellite transmitter unit, roughly one-quarter of the way along the length. Simulations indicate with proper air flow, the peak temperature rise is 12.8 degrees C. Compare this to the performance in FIG. 8b, which illustrates a more conventional rectangular cross section. In this example, the peak temperature rise is 12.3 degrees C., which is a mere 0.5 degrees C. less than the rounded cross section used in FIG. 8a. The weight reduction, however, is considerable. The rounded heat sink in FIG. 8a weighs 2.7 lbs, while the more conventional rectangular heat sink shown in FIG. 8b weighs 3.3 lbs. The rounded cross section heat sink weighs 18% less and performs essentially just as well as the conventional rectangular cross section heat sink.

Alternatively, embodiments of the invention include a satellite transmitter module for accepting input signals and emitting output signals for uplink transmission in a satellite communication system. The satellite transmitter module comprising a transmitter comprising transmitter circuitry for transmitting a suitable satellite communications signal. A heat sink thermally coupled to the transmitter, the heat sink includes two sets of heat sink fins. A first set of heat sink fins include fins with heights as a function of a distance between the plurality of heat sink fins and the transmitter. A second set of fins includes fins with a uniform height that is not affected by its distance to the transmitter. The two sets of heat sink fins are positioned in a close proximity to the transmitter for dissipating thermal energy generated from the transmitter. A fan, disposed at a distal end of the transmitter, generates air flow substantially parallel with spaces between the heat sink fins. An outer enclosure encloses the transmitter and the plurality of heat sink fins therein.

As a result reducing the height of some of the heat sink fins, the transmitter module can be designed to weigh less and to be smaller. Because portable satellite communications transmitters are vitally important in mobile newsgathering, military, etc. applications, the overall size and weight are extremely important factors in the portability of the overall satellite transmitter system. Furthermore, because the size and weight of the transmitter module is much smaller than conventional transmitters, the transmitter module may be mounted onto or into an integrated portable satellite communication system that includes a satellite dish, an upconverter, a modem, etc. Furthermore, in some embodiments the module may become a structural member of the transmitter system, such as replacing the arm, mount, boom, etc. on a traditional dish. Moreover, because the enclosure of the transmitter module may include a rounded cross section, the external aerodynamics are more favorable to higher winds, etc. when the portable system is deployed in the field. Additionally, the enclosure of the cross section may be constructed of a solar reflective material, such as reflective plastics, metals, ceramics, glass, etc., that assists in lowering the overall temperature of the transmitter module when out in the field.

In some further embodiments, a transceiver module may include a receiver module coupled with the transmitter module. This receiver module may receive and may process incoming communication signals from a satellite. As a result, this "transceiver" (transmit and receive) module may allow a user to both send signals to and receive signals from a distant satellite. The receiver module typically generates much less heat than a transmitter module and requires much less volume than the transmitter module. All of the techniques and advantages described above regarding the heat dissipation of the transmitter module also apply to receiver module and transceiver modules as well.

Still further, the figures depict preferred embodiments of a satellite transmitter system for purposes of illustration only. One skilled in the art will readily recognize from the foregoing discussion that alternative embodiments of the structures and methods illustrated herein may be employed without departing from the principles described herein. Thus, upon reading this disclosure, those of skill in the art will appreciate still additional alternative structural and functional designs for a system and a process for automatically extracting, transforming, and loading content data through the disclosed principles herein.

Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. An apparatus comprising:
   a transmitter unit comprising a transmitter circuitry;
   at least one heat sink coupled to the transmitter unit, the heat sink including a plurality of heat sink fins, wherein (i) at least two of the heat sink fins are of different fin heights, (ii) the heat sink is positioned in a close proximity to the transmitter circuitry and (iii) the fin heights of the heat sink fins are a function of the close proximity to the transmitter circuitry and amounts of heat from the transmitter circuitry;
   a fan configured to generate an air flow substantially parallel with spaces between the heat sink fins; and
   an outer enclosure (i) enclosing the transmitter unit and the heat sink fins therein, (ii) being impermeable to the air flow generated by the fan, and (iii) including a cross section shape substantially similar to a contour of the heat sink fins.

2. The apparatus of claim 1, wherein the cross section shape of the outer enclosure is substantially similar to a fan cross section shape defined by rotating blades of the fan.

3. The apparatus of claim 1, wherein the transmitter circuitry is situated along a central axis of the transmitter unit and in substantially a same direction as the air flow from the fan.

4. The apparatus of claim 3, wherein the height of one of the heat sink fins situated on the central axis of the transmitter unit is higher than the height of others of the heat sink fins when a number of the heat sink fins is odd.

5. The apparatus claim 3, wherein the heights of two of the heat sink fins situated closest to the central axis of the transmitter unit are higher than the heights of others of the heat sink fins when a number of the heat sink fins is even.

6. The apparatus of claim 1, wherein (i) the transmitter unit is coupled to another heat sink, and (ii) the another heat sink including another plurality of heat sink fins.

7. The apparatus of claim 1, wherein the heat sink fins are parallel to every other of the heat sink fins.

8. The apparatus of claim 1, wherein the cross section shape of the outer enclosure is a rounded shape.

9. The apparatus of claim 1, wherein the cross section shape of the enclosure is a polygonal shape.

10. The apparatus of claim 1, wherein the cross section shape of the outer enclosure is a circular shape or an elliptical shape.

11. The apparatus of claim 1, wherein the heat sink fins includes pin fins.

12. The apparatus of claim 1, wherein the transmitter circuitry includes a frequency converter unit configured to modify an input frequency of an input signal to an output frequency suitable to use in satellite communication.

13. The apparatus of claim 1, wherein the transmitter circuitry includes an amplifier unit configured to amplify an input power level of an input signal to an output power level suitable to use in satellite communication.

14. The apparatus of claim 1, wherein the transmitter circuitry further includes a receiver unit configured to convert an input satellite signal into an output data signal to be demodulated.

15. An apparatus comprising:
   a transmitter comprising a transmitter circuitry configured to transmit a satellite communications signal;
   at least one heat sink thermally coupled to the transmitter, the heat sink including a plurality of heat sink fins, wherein (i) at least two of the heat sink fins comprise heights as a function of a distance between the heat sink fins and the transmitter, and (ii) the heat sink is positioned in a close proximity to the transmitter;
   a fan, disposed at a distal end of the transmitter, and configured to generate an air flow substantially parallel with spaces between the heat sink fins; and
   an outer enclosure enclosing the transmitter and the heat sink fins therein.

16. The apparatus of claim 15, wherein a cross section shape of the outer enclosure is substantially similar to a contour of the heat sink fins.

17. The apparatus of claim 16, wherein the cross section shape of the outer enclosure is substantially similar to a fan cross section shape defined by rotating blades of the fan.

18. A method for reducing thermal energy in a transmitter comprising the steps of:
- connecting two sets of a plurality of heat sink fins to the transmitter, wherein (i) each of the heat sink fins includes a corresponding height, (ii) the heights of a first set of the heat sink fins are determined as a function of distance between the heat sink fins and the transmitter and (iii) the heights of a second set of heat sink fins are not determined as a function of distance between the heat sink fins and the transmitter;
- generating an air flow substantially parallel with spaces between the heat sink fins via a fan; and
- enclosing the heat sink fins and the transmitter in a housing.

19. The method of claim 18, wherein (i) a first set of the heat sink fins have heights that are determined as a function of distance between the each of the heat sink fins and the transmitter and (ii) a second set of the heat sink fins have heights that are not determined as a function of distance between the each of the heat sink fins and the transmitter.

20. The method of claim 18, wherein the housing comprises at least one cross section shape among (i) circular, (ii) elliptical, (iii) rounded-corner, and (iv) polygonal.

* * * * *